United States Patent [19]
Kikuchi et al.

[11] Patent Number: 5,970,818
[45] Date of Patent: Oct. 26, 1999

[54] NOTCH ALIGNMENT APPARATUS AND ADJUSTMENT JIG FOR THE SAME

[75] Inventors: Hisashi Kikuchi, Esashi; Mitsuru Obara, Mizusawa, both of Japan

[73] Assignee: Tokyo Electron Limited, Tokyo, Japan

[21] Appl. No.: 08/922,371

[22] Filed: Sep. 3, 1997

[30] Foreign Application Priority Data

Sep. 4, 1996 [JP] Japan ................................. 8-253804

[51] Int. Cl.$^6$ ............................ G05G 1/04; B65G 49/07; B21F 41/00
[52] U.S. Cl. ............................ 74/526; 414/936; 29/25.01
[58] Field of Search ................................. 74/813 L, 526, 74/527; 414/225, 331, 737, 937, 936; 29/564.6, 714, 741, 25.01; 15/88.2, 21.1, 77, 102

[56] References Cited

U.S. PATENT DOCUMENTS

| | | | |
|---|---|---|---|
| 4,051,593 | 10/1977 | Mori et al. | 29/564.6 |
| 4,378,189 | 3/1983 | Takeshita et al. | 414/225 |
| 5,007,302 | 4/1991 | Chen | 74/568 R |
| 5,685,039 | 11/1997 | Hamada et al. | 15/88.2 |

FOREIGN PATENT DOCUMENTS 6-345208  12/1994  Japan .
7-235587  9/1995  Japan .

*Primary Examiner*—Vinh T. Luong
*Attorney, Agent, or Firm*—Oblon, Spivak, McClelland, Maier & Neustadt, P.C.

[57] ABSTRACT

A notch alignment apparatus has a unit body (15), which can advance into a carrier (3) through a bottom opening (4) of the carrier (3), for aligning notches (2) formed in the peripheral edges of semiconductor wafers (1), which are contained in the carrier (3) and arrayed in a facing state. The unit body (15) is provided with a rotationally driving shaft (25) having a cylindrical shape, for coming into contact with the peripheral edges of the wafers (1) from below and driving the wafers (1) to rotate all together. A plurality of idle pulleys (26) independent of each other are arranged on one side of the driving shaft (25), for coming into contact with the peripheral edges of the wafers (1) from below. The idle pulleys (26) are supported by a common pulley shaft (27) to be independently and freely rotatable. A stopper or wafer guide (28) is arranged on the other side of the driving shaft (25), for stopping rotation of the wafers (1) by means of contact with the peripheral edges of the wafers (1). The stopper (28) is arranged such that the peripheral edge of each wafer (1) comes into contact with the stopper (28) when that the wafer (1) engages with the driving shaft (25) by its notch (2) and inclines. The driving shaft (25) and the pulley shaft (27) are driven to rotate along with each other in the same direction.

19 Claims, 5 Drawing Sheets

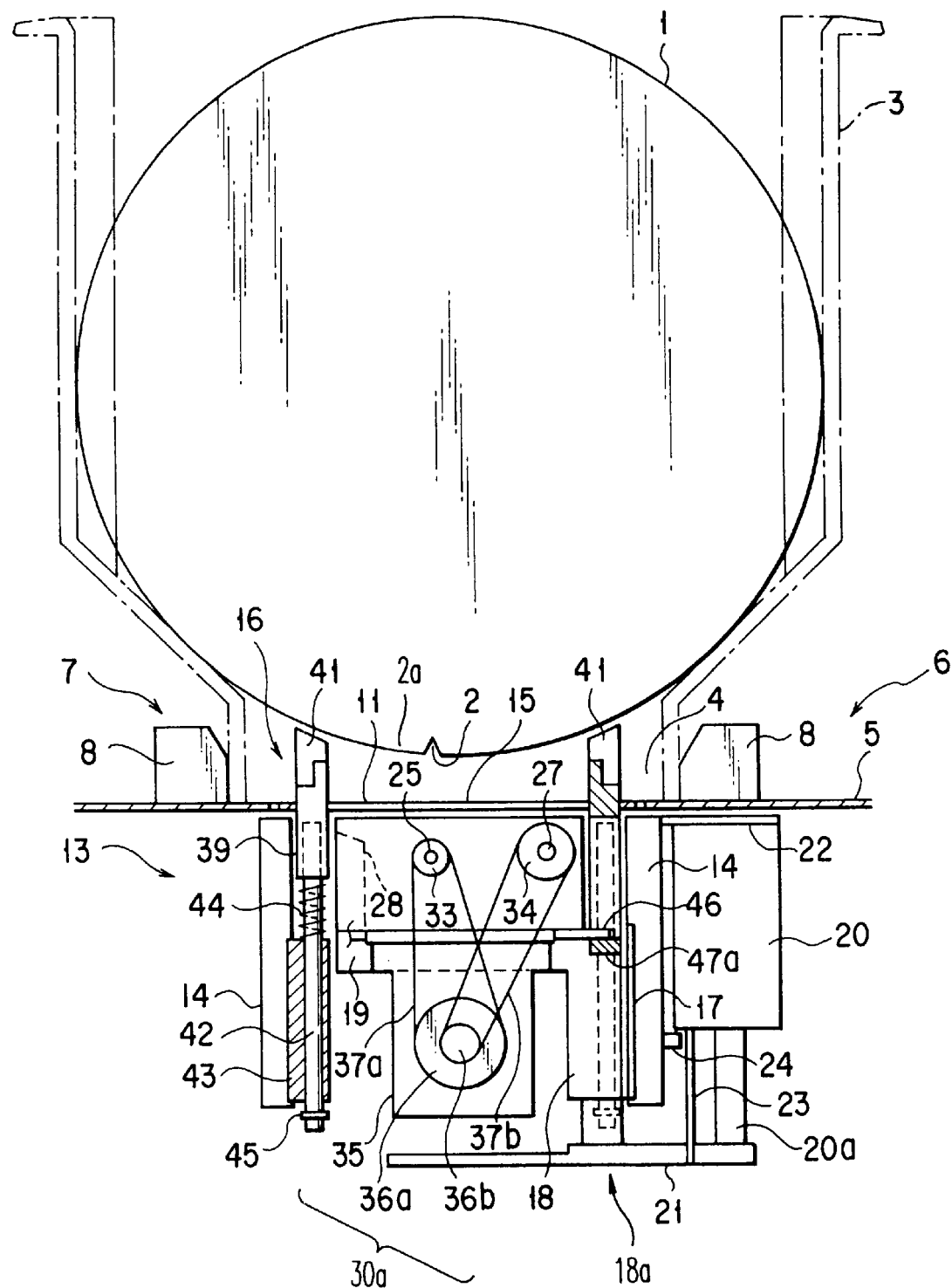
F I G. 1

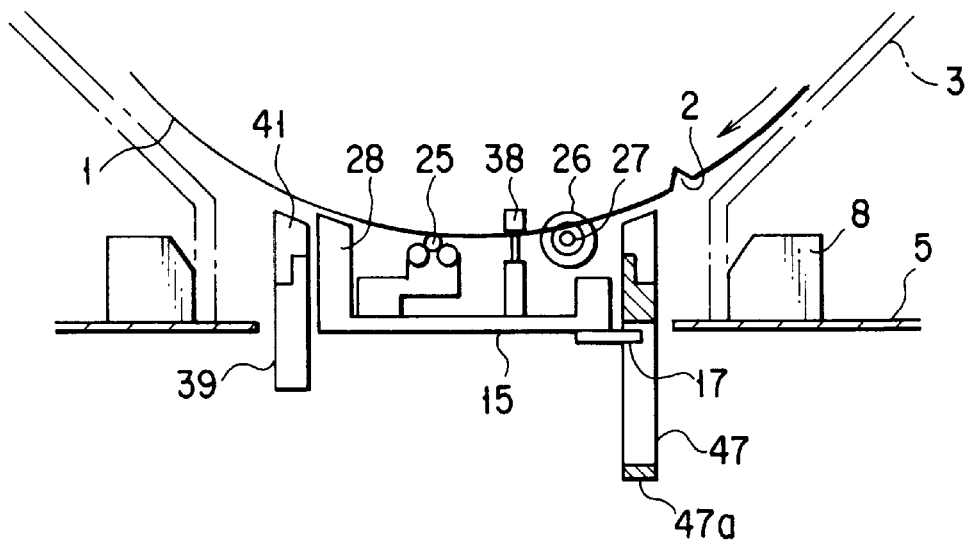
F I G. 5
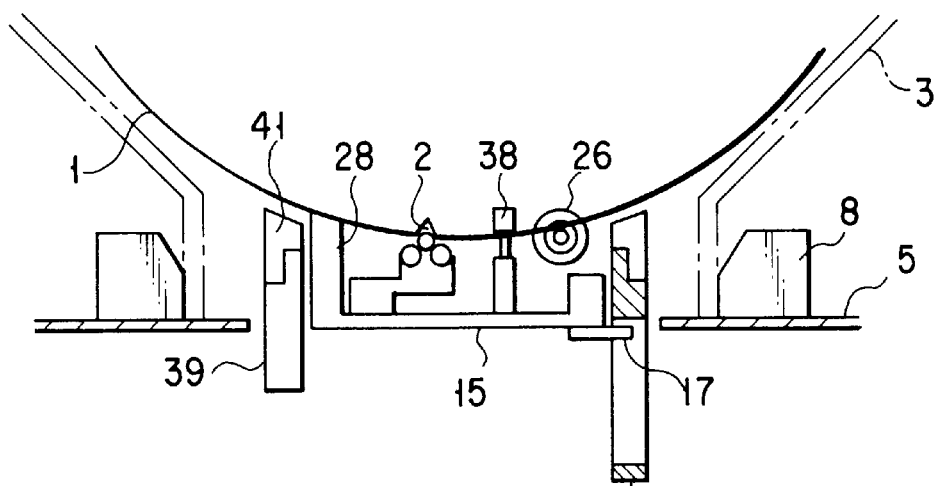
F I G. 6

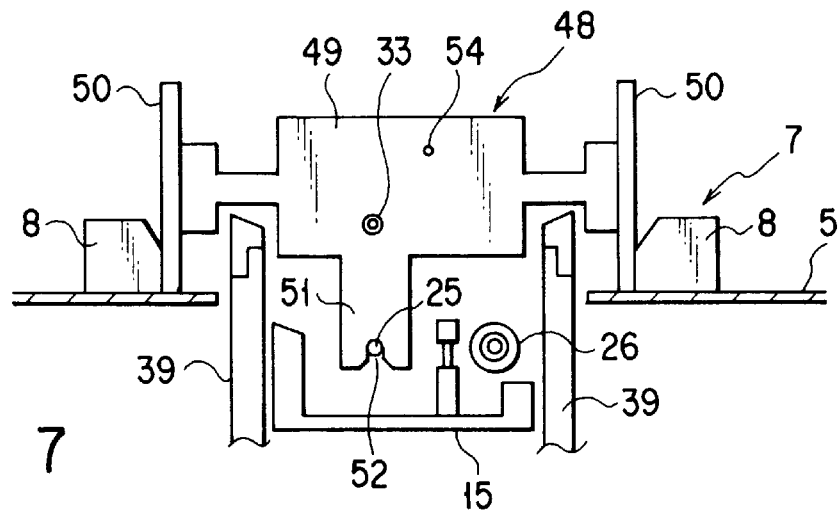
F I G. 7
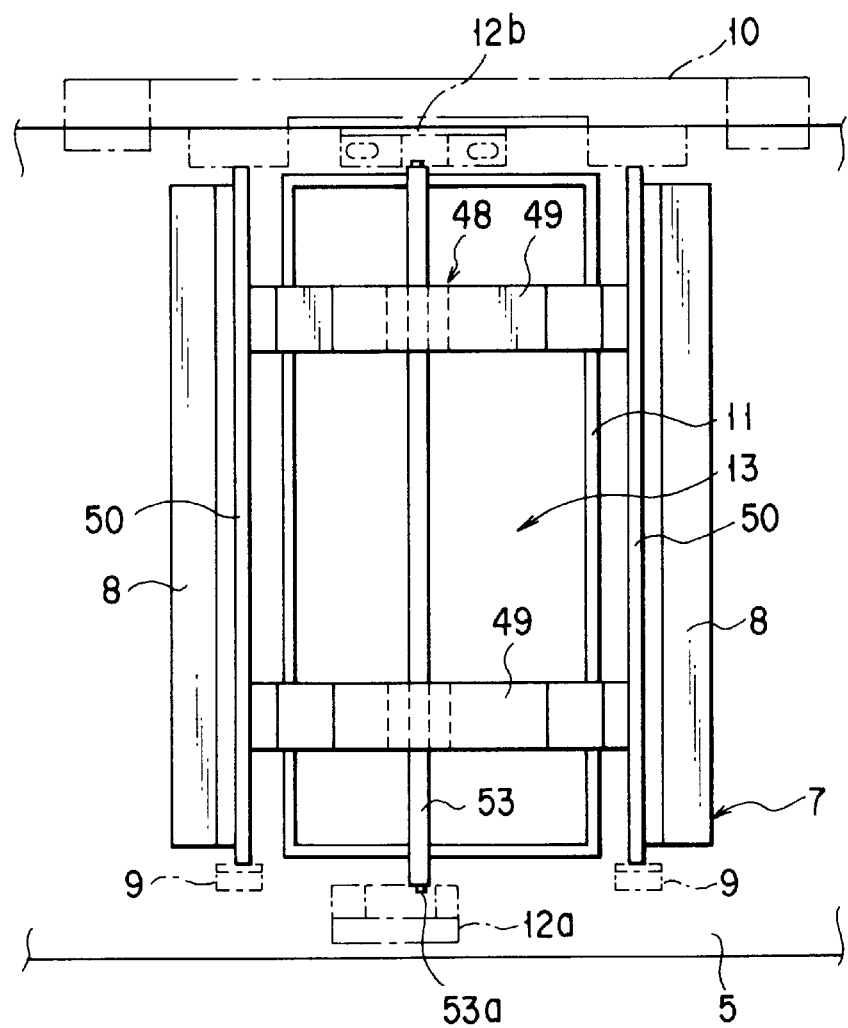
F I G. 8

bold text…

NOTCH ALIGNMENT APPARATUS AND ADJUSTMENT JIG FOR THE SAME

BACKGROUND OF THE INVENTION

The present invention relates to a notch alignment apparatus for aligning the notches of target objects, such as semiconductor wafers, contained in a container and arrayed in a facing state, and an adjustment jig for the notch alignment apparatus.

In manufacturing semiconductor devices, a container, which is also referred to as a carrier or cassette, is used for containing a plurality of target objects, i.e., semiconductor wafers, in a facing state when the wafers are transferred among processing steps. Semiconductor wafers are provided with orientation flats or notches, i.e., cut-out portions, respectively, at their peripheral edges to easily judge and align their crystal orientations.

Jpn. Pat. Appln. KOKAI Publication Nos. 6-345028 discloses a notch alignment apparatus for aligning the notches n of a plurality of semiconductor wafers W, contained in a container C and arrayed in a facing state. The apparatus have an alignment unit. The alignment unit has a driving shaft for coming into contact with the peripheral edges of the wafers from below to drive the wafers to rotate all together; a plurality of idle pulleys 20 independent of each other and arranged on one side of the driving shaft, for coming into contact with the peripheral edges of the wafers from below; and a stopper 30 arranged on the other side of the driving shaft, for stopping rotation of the wafers by means of contact with the peripheral edges of the wafers.

In this apparatus, each wafer W is essentially supported by the driving shaft and the corresponding idle pulley 20 while the wafer is rotated by the driving shaft. When the notch n of the wafer engages with the driving shaft and the wafer leans the peripheral edge of the wafer comes into contact with the stopper 30, thereby causing the wafer to stop its rotation. In this way, the notches of the wafers are aligned in the axial direction of the driving shaft.

Jpn. Pat. Appln. KOKAI Publication No. 7-235587 discloses a notch alignment apparatus for aligning the notches 2 of a plurality of semiconductor wafers 3, contained in a container 4 and arrayed in a facing state. The apparatus has an alignment unit 7 which is capable of moving up and down so that it can advance into the container through the bottom opening of the containers. The alignment unit has a driving shaft 11 (12) for coming into contact with the peripheral edges of the wafers from below to drive the wafers to rotate all together; a plurality of idle pulleys 43 independent of each other and arranged on one said of the driving shaft, for coming into contact with the peripheral edges of the wafers from below; and a stopper 28 arranged on the other side of the driving shaft, for stopping rotation of the wafers by means of contact with the peripheral edges of the wafers.

In this apparatus each wafer W is essentially supported by the driving shaft 11 and the corresponding idle pulley 43 while the wafer is rotated by the driving shaft. When the notch 2 of the wafer engages with the driving shaft and the wafer inclines, the peripheral edge of the wafer comes into contact with the stopper 28, thereby causing the wafer to stop its rotation. In this way, the notches of the wafers are aligned in the axial direction of the driving shaft.

In this type apparatus, however, alignment of the notches can not be correctly performed on occasion, because slip is caused between the driving shaft and the wafers, or the notches pass over the driving shaft, depending on the state of the wafers, for example, a state brought about after film formation. More specifically, the driving shaft is generally coated with a fluoro-resin to enhance its physical and chemical withstand capability, which in return results in a low frictional resistance. On the other hand, the peripheral edges of the wafers also have a low friction resistance, and much less especially after a film formation process, depending on the film material. Further, each notch generally has an opening width smaller than the diameter of the driving shaft. In addition, after a film formation process, the size of each notch becomes slightly smaller. As a result, the notches become apt to pass over the driving shaft. In this respect, the driving shaft may be coated with silicone rubber to improve the rotational driving capability of the driving shaft, but the silicone rubber is easily worn out.

On the other hand, such a notch alignment apparatus is known that has an optical sensor for confirming alignment of the notches. See U.S. Pat. No. 5,533,243. The sensor senses alignment of the notches in a state where the wafers are supported by and in a container after a notch alignment operation is finished and an alignment unit is moved down. By using the optical sensor, it is possible to raise an alarm or to repeat the notch alignment operation, if the notch alignment has not been correctly performed.

However, in the apparatus of this type, the notches and the optical axis of the optical sensor are not lined up on occasion due to a deformation or dimensional error of the container, thereby bringing about a sensing error. Further, the sensing accuracy of the optical sensor depends on its arranged state. Since the notch alignment apparatus is periodically disassembled, cleaned, and reassembled, it becomes more important to assemble it with high precision.

BRIEF SUMMARY OF THE INVENTION

Therefore, an object of the present invention resides in providing a notch alignment apparatus which can perform a notch alignment operation with high reliability, and an adjustment jig for the apparatus.

Another object of the present invention is to provide a notch alignment apparatus which can confirm notch alignment with high reliability, and an adjustment jig for the apparatus.

According to a first aspect of the present invention, there is provided a notch alignment apparatus for aligning notches formed in peripheral edges of a plurality of target substrates, which are contained in a container having a bottom opening and are arrayed in a facing state, through the bottom opening, the apparatus comprising:

a rotationally driving shaft having a cylindrical shape, for coming into contact with the peripheral edges of the substrates from below and driving the substrates to rotate all together, the driving shaft having a rotational axis in parallel to a direction in which the substrates are arrayed;

a plurality of idle pulleys independent of each other and arranged on one side of the driving shaft, for coming into contact with the peripheral edges of the substrates from below, the idle pulleys having a rotational axis substantially parallel to the rotational axis of the driving shaft, and being supported by a common pulley shaft to be freely rotatable, wherein each one of the substrates is substantially supported by the driving shaft and each one of the idle pulleys while the one of the substrates is rotated by the driving shaft;

a stopper arranged on another side of the driving shaft, for stopping rotation of the substrates by means of contact with the peripheral edges of the substrates, wherein the peripheral edge of each one of the substrates comes into contact with the stopper when the one of the substrates engages with the driving shaft by its notch and leans; and a rotationally driving mechanism for driving the driving shaft and the pulley shaft to rotate along with each other in the same direction.

According to a second aspect of the present invention, there is provided a notch alignment apparatus for aligning notches formed in peripheral edges of a plurality of target substrates, which are contained in a container having a bottom opening and are arrayed in a facing state, through the bottom opening, the apparatus comprising:

a rotationally driving shaft having a cylindrical shape, for coming into contact with the peripheral edges of the substrates from below and driving the substrates to rotate all together, the driving shaft having a rotational axis in parallel to a direction in which the substrates are arrayed;

a plurality of idle pulleys independent of each other and arranged on one side of the driving shaft, for coming into contact with the peripheral edges of the substrates from below, the idle pulleys having a rotational axis substantially parallel to the rotational axis of the driving shaft, and being supported by a common pulley shaft to be freely rotatable, wherein each one of the substrates is substantially supported by the driving shaft and each one of the idle pulleys while the one of the substrates is rotated by the driving shaft;

a stopper arranged on another side of the driving shaft, for stopping rotation of the substrates by means of contact with the peripheral edges of the substrates, wherein the peripheral edge of each one of the substrates comes into contact with the stopper when the one of the substrates engages with the driving shaft by its notch and leans;

an optical notch sensor for confirming alignment of the notches; and a holder for holding the substrates all together in the container at a height separated from a bottom wall of the container, when alignment of the notches is confirmed.

According to a third aspect of the present invention, there is provided an adjustment jig to be used for a notch alignment apparatus for aligning notches formed in peripheral edges of a plurality of target substrates, which are contained in a container having a bottom opening and are arrayed in a facing state, through the bottom opening, the apparatus comprising, a work table for mounting the container, a guide for positioning the container on the work table, a rotationally driving shaft having a cylindrical shape, for coming into contact with the peripheral edges of the substrates from below and driving the substrates to rotate all together, the driving shaft having a rotational axis in parallel to a direction in which the substrates are arrayed, and an optical notch sensor for confirming alignment of the notches, the adjustment jig comprising:

a guide reference plane for engaging with the guide to position the guide;

a driving shaft reference groove for engaging with the driving shaft to position the driving shaft; and a sensor reference line for engaging with the notch sensor to position the notch sensor.

BRIEF DESCRIPTION OF THE SEVERAL VIEWS OF THE DRAWING

FIG. 1 is a partially cross-sectional front view showing a notch alignment apparatus according to an embodiment of the present invention;

FIG. 5 is a partially cross-sectional front view showing a state where a notch alignment operation is being performed in the apparatus shown in FIG. 1;

FIG. 6 is a partially cross-sectional front view showing a state immediately after the notch alignment operation is finished in the apparatus shown in FIG. 1;

FIG. 7 is a partially cross-sectional front view showing a state where an adjustment jig is mounted on the apparatus shown in FIG. 1; and FIG. 8 is a schematic plan view showing the state of FIG. 7.

DETAILED DESCRIPTION OF THE INVENTION

Figure 2:
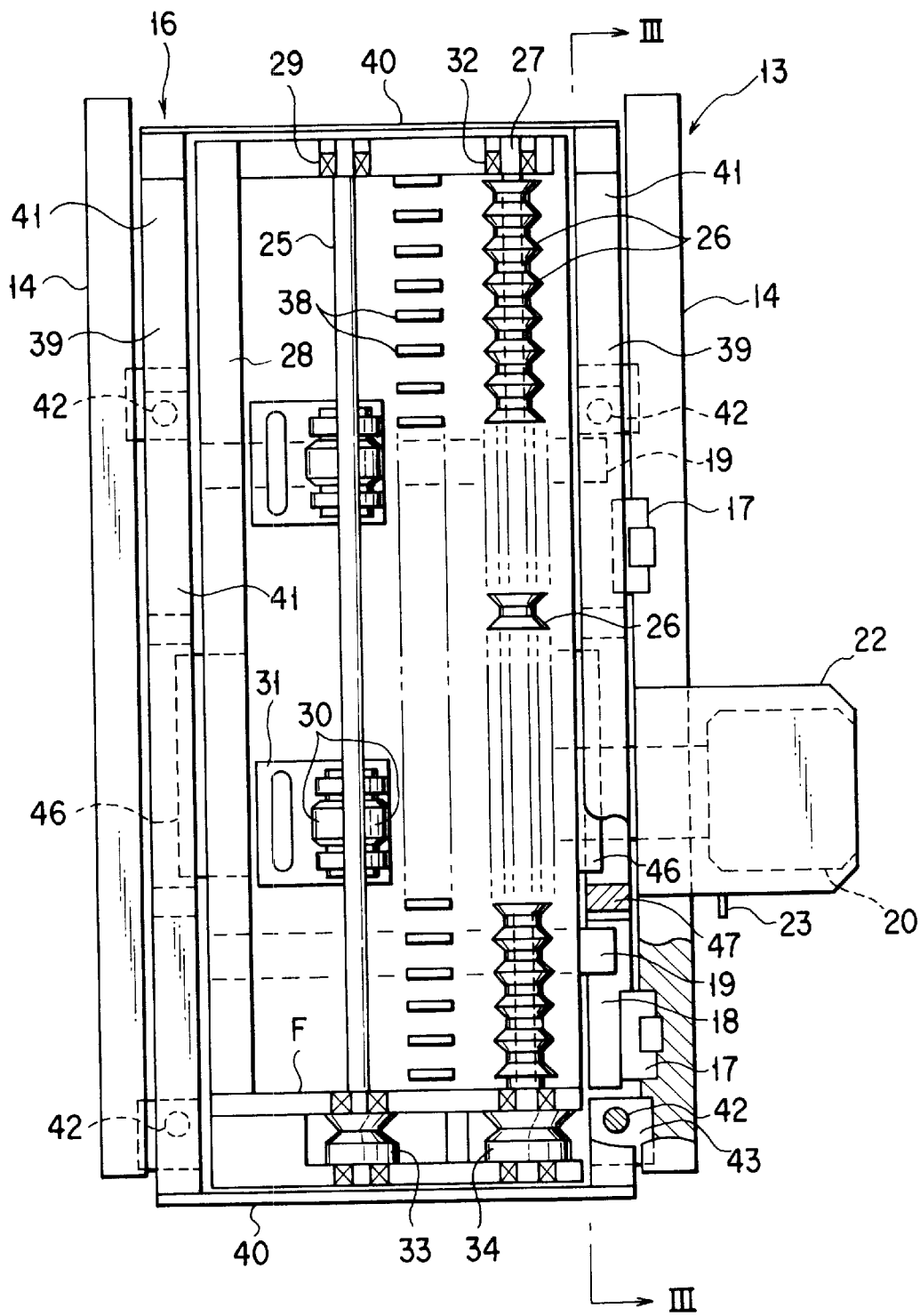
FIG. 2 is an enlarged plan view showing an alignment unit employed in the apparatus shown in FIG. 1.

As shown in FIG. 1, a semiconductor wafer 1 formed of a circular plate, i.e., a target object to be processed, is provided with a notch 2 at its peripheral 2a edge. A plurality of, for example, 25 wafers 1 are contained in a container, i.e., a carrier 3, such that they stand vertically and are arrayed in a facing state with a predetermined pitch. The top of the carrier 3 is opened to transfer the wafers 1 into and out of it. The carrier 3 is also provided with an opening 4 at its bottom to allow a notch alignment operation to be performed.

A work table 5, on which the carrier 3 or carriers 3 can be placed, is arranged at a carrier-in/out port of a processing apparatus for subjecting the wafers 1 to a process, such as CVD. The work table 5 is provided with a notch alignment apparatus 6 for aligning the notches of the wafers 1 contained in the carrier 3. The notch alignment apparatus 6 has setting means 7 on the work table 5, for positioning the carrier 3.

The setting means 7 is mainly constituted by a pair of side guides 8, which are also referred to as carrier guides, for positioning the carrier 3 in its width direction, and a front guide 9 and a rear guide 10 for positioning the carrier 3 in its longitudinal direction as shown in FIG. 8. The front and rear guides 9 and 10 are moved back and forth by an air cylinder (not shown) to hold the carrier from the front and rear sides. The work table 5 is rotatable so that the carrier 3 can be switched from a horizontal state to a vertical state and vice versa, when the carrier is transferred into and out of the work table by a carrier transfer mechanism (not shown) arranged in the processing apparatus.

Figure 3:
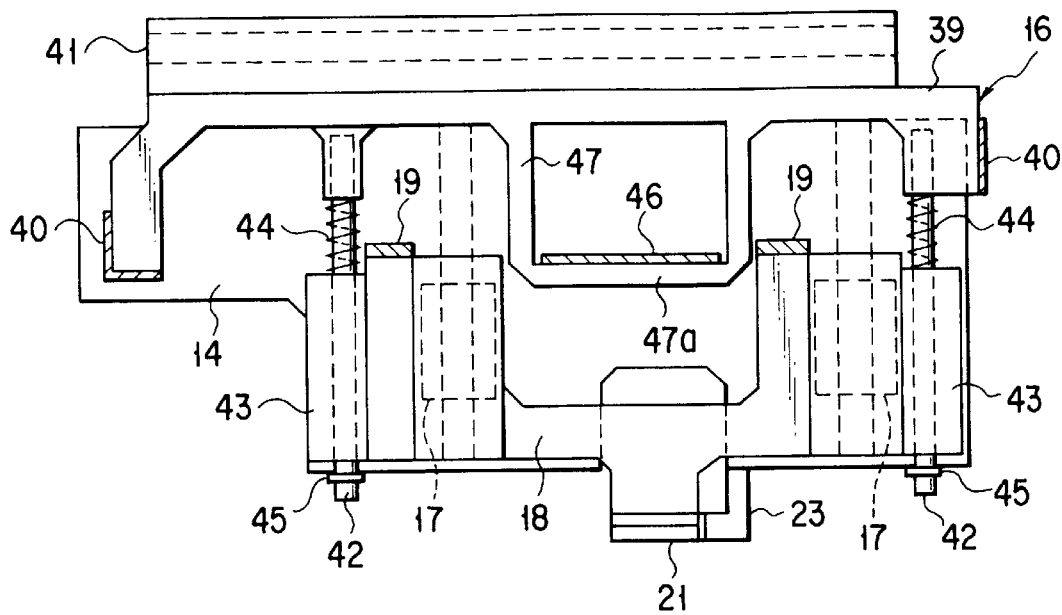
FIG. 3 is a schematic cross-sectional view cut along line III—III in FIG. 2.

An access opening 11 for communicating with the bottom opening 4 of the carrier 3 is formed in the work table 3. As shown in FIG. 8, there is an optical sensor, i.e., a notch sensor consisting of light-emitting and light-receiving elements 12a and 12b for confirming a notch alignment state, arranged at front and rear positions on the work table 5 to interpose the access opening 11. Further, below the access opening 11 of the work table 5, a notch alignment unit 13 is arranged to be movable up and down. The notch alignment unit 13 has fixed frames 14 one on either side, as shown in FIGS. 1, 2 and 3. The fixed frames 14 are fixed under the work table 5 and a unit body 15 is arranged between the fixed frames 14. A holding mechanism 16, which is also referred to as a wafer holding mechanism, is arranged between the unit body 15 and the fixed frames 14, for holding all the wafers 1 at a certain height when a notch alignment state is confirmed by the notch sensor 12a, 12b.

An elevating mechanism 18a is shown in FIG. 1. Inside one of the fixed frames 14, an elevator base 18 is supported to be movable up and down by a pair of elevator guides 17, i.e., linear guides. The unit body 15 is mounted on and fixed to a pair of arms 19 horizontally extending from the top end of the elevator base 18. An air cylinder 20 for elevating the elevator base 18 is connected to the bottom end of the elevator base 18 by a piston rod 20 through a horizontally connecting bar 21. The air cylinder 20 is attached upside down by a bracket outside said one of the fixed frames 14. In order to detect the elevated height of the unit body 15, the connecting bar 21 is provided with a standing target bar 23. On the other hand a sensor 24 is mounted on the fixed frame 14, for sensing shift of the target bar 23. The unit body 15 is controlled over its vertical movement to have a certain stroke, e.g., an elevating stroke of 30 mm.

The unit body 15 includes a driving shaft 25 having a cylindrical shape, for coming into contact with the peripheral edges 2a of the wafers 1 in the carrier 3 from below to drive the wafers 1 to rotate all together. The driving shaft 25 has a rotational axis in parallel to a direction in which the wafers 1 are arrayed. A plurality of idle pulleys 26 independent of each other are arranged on one side of the driving shaft 25, for coming into contact with the peripheral edges of the wafers 1 from below. The idle pulleys 26 have a rotational axis essentially parallel to the rotational axis of the driving shaft 25. The idle pulleys 26 are supported by a common pulley shaft 27 such that they can rotate freely and independently of each other. A stopper 28, which is also referred to as a wafer guide, is arranged on the other side of the driving shaft 25, for stopping rotation of the wafers 1 by means of contact with the peripheral edges of the wafers 1. The stopper 28 is arranged such that, when the notch of each wafer 1 engages with the driving shaft 25 and the wafer leans, the peripheral edge of the wafer comes into contact with the stopper 28. The driving shaft 25, the pulley shaft 27, and the stopper 28 are arranged to extend parallel to the longitudinal direction of the unit body 15.

The driving shaft 25 is formed of a cylindrical rod, which is made of stainless steel and coated with a fluoro-resin, and its opposite ends in the longitudinal direction are rotatably supported by bearings 29. The driving shaft 25 has an outer diameter of 3.5 mm which is slightly smaller than the opening width of each notch 2. With this arrangement, it is possible to prevent each notch 2 from passing over the driving shaft 25, and to improve reliability in positioning during a notch alignment operation. The unit body 15 has supporting rollers 30 rotatably attached by roller brackets 31 to suitably support middle portions of the driving shaft 25, in order to prevent the driving shaft 25 having such a small diameter from being warped.

The pulley shaft 27 is formed of a cylindrical rod, which is made of stainless steel. The pulley shaft 27 freely penetrates the idle pulleys 26, the number of which corresponds to that of the wafers, so that the idle pulleys 26 are supported to be rotatable independently of each other. The idle pulleys 26 are made of a fluoro-resin and each having a hand-drum shape. The opposite ends of the pulley shaft 27 in the longitudinal direction are rotatably supported by bearings 32. The pulley shaft 27 is rotated in synchronism with the driving shaft 25 in the same direction, so as to improve the rotational characteristic of the wafers 1 during a notch alignment operation.

More specifically, transmission pulleys 33 and 34 are attached to ends of the driving shaft 25 and the pulley shaft 27, respectively. A common driving motor 35 is arranged in the lower part of the unit body 15, and is provided with a large pulley 36a and a small pulley 36b on its output shaft. The transmission pulley 33 of the driving shaft 25 is connected to the large pulley 36a through an endless belt 37a while the transmission pulley 34 of the pulley shaft 27 is connected to the small pulley 36b through an endless belt 37b. In other words, in this transmission structure 30a, the rotationally driving force of the motor 35 is transmitted to the driving shaft 25 and the pulley shaft 27 with gear ratios different from each other. The ratio between the rotational speeds of the driving shaft 25 and the pulley shaft 27 is preferably set such that the driving shaft 25 and the idle pulleys 26 have essentially the same speed at portions in contact with the peripheral edges of the wafers 1, i.e., they have the same peripheral velocity. With this arrangement, it is possible to further improve the rotational characteristic of the wafers 1 during a notch alignment operation. The motor 35 is driven for a certain period of time, for example, necessary for allowing the wafers 1 to make two turns, from a moment when the unit body 15 is moved up to an upper dead point and starts supporting the wafers 1 by the driving shaft 25 and the idle pulleys 26.

The stopper 28, i.e., the wafer guide, is formed of a synthetic resin, and its top end is sloped to support the peripheral edges of the wafers 1. As shown in FIG. 5, the peripheral edge of each wafer 1 is out of contact with the stopper 28 in a state where its notch 2 does not engage with the driving shaft 25. As shown in FIG. 6, when the notch 2 engages with the driving shaft 25, the wafer 1 inclines about the corresponding idle pulley 26 and comes into contact with the stopper 28. With this contact, the wafer 1 stops rotating, so that the corresponding idle pulley 26 also stops rotating. As a result, the driving shaft 25 and the pulley shaft 27 rotate in idle states relative to the stopped wafer 1 and idle pulley 26.

The unit body 15 is provided with wafer sensors 38 of an optical type, which are also referred to as wafer count sensors, between the driving shaft 25 and the idle pulleys 26, for detecting the presence and absence of the wafers 1, and more specifically the position and the number of the wafers 1. The wafer sensors 38 are arranged in a comb-like shape to be inserted in the gaps between the wafers 1, respectively.

The holding mechanism 16 has a pair of long frames 39 one on either right or left side, arranged between both of the fixed frames 14 and the unit body 15 not to interfere with the elevator base 18. The long frames 39 are connected to each other by connecting frames 30 at their ends. With this arrangement, an integral frame body having a rectangular shape in its plan view is formed to surround the unit body 15 out of contact therewith. Holders 41 made of synthetic resin are respectively arranged on the top portions of the long frames 39, for coming into contact with the peripheral edges of the wafers 1 from below to hold the wafers 1.

The top end of each holder is sloped to support the peripheral edges 2a of the wafers 1, like the stopper 28. In this embodiment, since the wafers 1 are positioned and arrayed at certain distances by wafer-guide grooves formed on the idle pulleys 26 and the comb-like wafer sensors 28, the holders 41 and the stopper 28 have no wafer-positioning grooves. However, wafer-positioning grooves may be formed on the holders 41 and the stopper 28.

Figure 4:
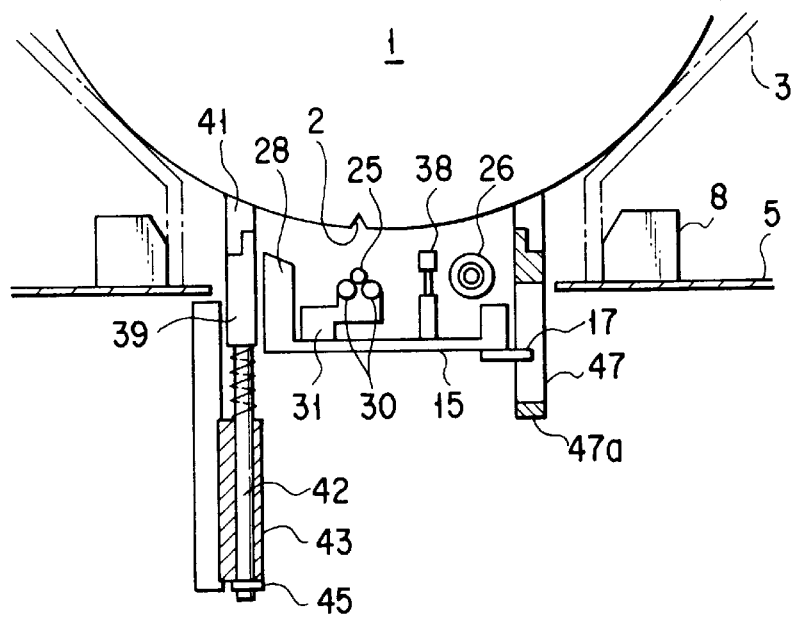
FIG. 4 is a partially cross-sectional front view showing a state where a wafer is held by holders in the apparatus shown in FIG. 1.

The long frames 39 supporting holders 41 are located at a waiting position (lower dead point), where the holders 41 are out of contact with the wafers 1 contained in the carrier 3, as shown in FIG. 1, when the carrier 3 is mounted on the work table 5. The long frames 39 are moved up to a holding position (upper dead point), where the holders 41 can hold the wafers 1 to be independent of the carrier 3, as shown in FIG. 4, when a notch alignment state is confirmed by the sensor 12a, 12b. In this embodiment, the long frames 39 and the unit body 15 are moved up and down along with and in close cooperation with each other, such that the long frames 39 reach the holding position at an early time during ascent of the unit body 15, and reach the waiting position at a late time during descent of the unit body 15. In other words, the holders 41 are moved up and down in a certain vertical stroke of, for example, 3 mm, which is smaller than that of the unit body 15.

In order to move the long frames 39 in closer cooperation with the unit body 15, the following structure is adopted. Namely, as shown in FIGS. 1, 2, and 3, each of the long frames 39 is provided with two guide rods 42 extending downward. Inside the fixed frames 14, guide bushes 43 are arranged, for slidably supporting the guide rods 42. The guide rods 42 are provided with coil springs 44, respectively, which are arranged between the long frames 39 and the guide bushes 43 to bias the long frames 39 upward. Further, the guide rods 42 are provided with rings 45, respectively, which are attached at their lower ends under the guide bushes 43 to prevent detachment of the guide bushes 43 and to determine the upper dead point. In other words, when the rings 45 are brought into contact with the bottom ends of the guide bushes 43, the holders 41 are placed at a position for holding the wafers 1 such that the wafers 1 are separated from the bottom wall of the carrier 3 (see FIG. 4).

The unit body 15 is provided with extending plates 46 horizontally extending in opposite directions from the opposite sides of the lower part of the unit body 15. The long frames 39 supporting the holders 41 have opening frame portions 47, respectively, which allow the extending plates 46 to move up and down. Each opening frame portion 47 has a bottom side 47a for engaging with the corresponding extending plate 46 positioned at the lower dead point. In other words, when the unit body 15 is placed at the lower dead point, the extending plates 46 engage with the bottom sides 47a of the opening frame portions 47, thereby holding the long frames 39 along with the holders 41 at the waiting position against the bias force of the springs 44. On the other hand, when the extending plates 46 are moved upward along with the unit body 15, the long frames 39 are moved along with the holders 41 up to the holding position by the bias force of the springs 44.

The notch sensor 12a, 12b is activated when the wafers 1 are transferred onto the holders 41 and the driving shaft 25 is separated from the notches 2 due to descent of the unit body 15 after a notch alignment operation. The notch sensor 12a, 12b emits a light beam along its optical axis to detect a notch alignment state, i.e., whether the notches 2 are aligned or not. The notch sensor 12a, 12b takes signals therein during movement of about 20 mm included in the entire stroke (30 mm) of the unit body 15, from a moment when the driving shaft 25 is separated from the notches 2 to a moment when the holders 41 start descent. Where the notches 2 are detected as not being aligned, an alarm may be raised or a notch alignment operation may be tried again. The number of tries can be arbitrarily determined.

An operation of the notch alignment apparatus having the above-described structure will be explained.

At first, as shown in FIG. 1, the carrier 3 containing the wafers 1 is set by the carrier guides 8 on the work table 5 arranged at the carrier-in/out port of the processing apparatus. Then, the front guide 9 and the rear guide 10 are activated, so that the carrier 3 is held by them from the front and rear sides. Then, the unit body 15 of the notch alignment unit 13 is moved up by the air cylinder 20 to start a notch alignment operation.

Due to ascent of the extending plates 46 along with the unit body 15, the long frames 39 of the holding mechanism 16 is at first moved by the bias force of the spring 44, from the waiting position up to the holding position. As a result, the wafers 1 are slightly separated from the bottom wall of the carrier 3 and are held by the holders 41, as shown in FIG. 4. Then, the unit body 15 is moved up to the upper dead point, and the driving shaft 25 and the idle pulley 26 receive the wafers 1 from the holders 41 and support them, as shown in FIG. 5. In this state, the position and the number of the wafers 1 in the carrier 3 are detected by the wafer sensors 38. Then, the driving shaft 25 and the pulley shaft 27 are driven to rotate by the motor 35. The idle pulleys 26 are also rotated due to the rotation of the pulley shaft 27, thereby stably rotating the wafers 1 while preventing slip from being caused between the driving shaft 25 and the wafers 1.

When the notch 2 of each wafer 1 reaches the position of the driving shaft 25 and engages with the driving shaft 25, as shown in FIG. 6, the wafer 1 rotates about the corresponding idle pulley 26 and comes into contact with stopper 28. As a result, the wafer 1 falls in a state where it is supported by the idle pulley 26 and the stopper 28, whereby the wafer 1 and the corresponding idle pulley 26 stop rotating. When those wafer 1 and idle pulley 26 stop rotating, the driving shaft 25 and the pulley shaft 27 rotate in idle states relative to the stopped wafer 1 and idle pulley 26. The notches 2 of all the wafers 1 are positioned and aligned, while being subjected to the above described steps.

After the motor 35 is rotated for a certain period of time, the unit body 15 is moved down by the air cylinder 20. Due to this descent of the unit body 15, the wafers 1 are held again by the holders 41 of the holding mechanism 16, as shown in FIG. 4. When the driving shaft 25 is separated from the notches 2, the notch sensor 12a, 12b is activated to detect the alignment state of the notches 2. Since the notch sensor 12a, 12b detect the notch alignment state while the wafers 1 are held independently of the carrier 3, it is possible to solve detection errors due to deformation or dimensional errors of the carrier 3, etc., thereby improving detection accuracy.

Close to a moment when the unit body 15 reaches the dead point position, the extending plates 46 come to engage with the bottom sides 47a of the opening frame portions 47 arranged in the long frames 39. As a result, the long frames 39 are pushed down against the bias force of the spring 44, and are returned to the waiting position. Subsequently, the unit body 15 reaches the lower dead point position, as shown in FIG. 1, and the sequential notch alignment and detection operations are completed.

As described above, in the notch alignment apparatus according to this embodiment, the driving shaft 25 is formed thin, and the pulley shaft 27 is driven to rotate along with the driving shaft 25. With this arrangement, the characteristics in rotation and positioning during a notch alignment operation are improved, thereby increasing reliability of the notch alignment operation. Further, the alignment state of the notches 2 is detected by the notch sensor 12a, 12b while the wafers 1 are held at a certain height by the holding mechanism 16. With this arrangement, it is possible to solve detection errors due to either deformation or dimensional errors of the carrier 3, etc., thereby improving detection accuracy by the notch sensor 12a, 12b. Furthermore, the holding mechanism 16 is moved up and down along with the notch alignment unit 13. With this arrangement, the necessary driving means can consist of only one air cylinder 20, thereby allowing the structure to be simple and allowing the notch alignment apparatus to be compact and less expensive.

FIGS. 7 and 8 show an adjustment jig used for the notch alignment apparatus. The adjustment jig 48 is mainly constituted by a pair of blocks 49 separately arranged with a certain distance therebetween, and side bars 50 bridging the opposite sides of the blocks 49.

The blocks 49 are provided with projecting portions 51, respectively, extending downward. Engaging grooves 52 are respectively formed at the ends of the projecting portions 51, for engaging with the driving shaft 25 of the notch alignment unit 13. By engaging the grooves, i.e., reference grooves 52, with the driving shaft 25, the adjustment jig 48 is positioned in its width direction. In this positioned state in the width direction, the adjustment jig 48 is positioned in its longitudinal direction, by aligning an outer end surface of the blocks 49 with a reference plane F (see FIG. 2) of the notch alignment unit 13.

Both of the side bars 41 are used as guide reference planes for positioning the guides of the setting means 7. The positions of the carrier guides 8 can be adjusted by the side surfaces of the side bars 50, and the positions of the front and rear guides 9 and 10 can be adjusted by the end portions of the side bars 50 in the longitudinal direction.

A positioning rod 53 is attached to the blocks 49 and used as a sensor reference line for positioning the notch sensor. The positioning rod 53 penetrates the blocks 49 to agree with the optical axis of the notch sensor 12a, 12b. The positioning rod 53 is provided with projecting portions 53a at its end portions in the longitudinal direction to engage with the light-transmitting holes of the notch sensor 12a, 12b.

Confirmation holes 54 are respectively formed in the blocks 49, for confirming transmission of a light beam emitted form the notch sensor 12a, 12b by actually setting the light beam to pass through the holes 54 after the notch alignment apparatus 6 is adjusted by the adjustment jig 48. The confirmation holes 54 are designed such that they agree with the optical axis of the notch sensor 12a, 12b when the adjustment jig 48 is mounted on the setting means 7 upside down.

As described above, the adjustment jig 48 has the reference grooves 52 for positioning the driving shaft 25, the guide reference planes of the side bars 50 for positioning the guides 8, 9, and 10, and the sensor reference line of the rod 53 for positioning the notch sensor 12a, 12b. With this arrangement, it is possible to eliminate differences among operators in assembling and adjusting the notch alignment apparatus 6, thereby improving detection accuracy of the notch sensor 12a, 12b and notch alignment accuracy.

Although the present invention has been described with reference to the embodiment shown in the drawings, the invention is not limited to the embodiment, but various modifications may be made without departing from the spirit or scope of the invention. For example, the holding mechanism 16 is moved up and down along with the notch alignment unit 13 in the embodiment, but they may be independently moved up and down.

We claim:

1. A notch alignment apparatus for aligning notches formed in peripheral edges of a plurality of target substrates, which are contained in a container having a bottom opening and are arrayed in a facing state, through said bottom opening, said apparatus comprising:

a rotationally driving shaft having a cylindrical shape, configured to contact the peripheral edges of the substrates from below and to drive the substrates to rotate all together, said driving shaft having a rotational axis in parallel to a direction in which the substrates are arrayed;

a plurality of idle pulleys independent of each other and arranged on one side of said driving shaft, to contact the peripheral edges of the substrates from below, said idle pulleys having a rotational axis parallel to the rotational axis of said driving shaft, and being supported by a freely rotatable common pulley shaft, wherein each one of the substrates is supported by said driving shaft and said idle pulleys while the substrates are rotated by said driving shaft;

a stopper arranged on another side of said driving shaft, configured to stop a rotation of the substrates by contacting the peripheral edges of the substrates, wherein the peripheral edge of each one of the substrates comes into contact with said stopper when the substrates engage with said driving shaft by their notch and thus the substrates lean; and a rotational driving mechanism configured to drive said driving shaft and said freely rotatable common pulley shaft to rotate along with each other in the same direction.

2. The apparatus according to claim 1, comprising a work table configured to mount said container and a guide configured to position said container on said work table.

3. The apparatus according to claim 2, comprising an elevating mechanism configured to move said driving shaft, said idle pulleys, and said stopper up and down in said container through said bottom opening.

4. The apparatus according to claim 3, wherein said work table comprises an access opening arranged to face said bottom opening of said container such that said driving shaft, said idle pulleys, and said stopper are retreated under said access opening by said elevating mechanism.

5. The apparatus according to claim 1, wherein said driving shaft has a diameter smaller than an opening width of the notches.

6. The apparatus according to claim 1, wherein said driving shaft and said pulley shaft have a ratio of rotational speeds, which is set such that said driving shaft and said idle pulleys have the same peripheral velocity.

7. The apparatus according to claim 6, wherein said rotational driving mechanism comprises a common motor, and a transmission configured to transmit a rotationally driving force of said common motor to said driving shaft and said pulley shaft with gear ratios different from each other.

8. The apparatus according to claim 1, comprising an optical notch sensor configured to confirm alignment of the notches.

9. The apparatus according to claim 8, comprising a holder configured to hold said substrates all together in said container at a height separated from a bottom wall of said container, when alignment of the notches is confirmed.

10. The apparatus according to claim 9, comprising an elevating mechanism configured to move said driving shaft, said idle pulleys, said stopper, and said holder up and down in said container through said bottom opening, said elevating mechanism is designed such that said holder is moved along with said driving shaft, said idle pulleys, and said stopper, up and down in a stroke shorter than those of said driving shaft, said idle pulleys, and said stopper.

11. A notch alignment apparatus for aligning notches formed in peripheral edges of a plurality of target substrates, which are contained in a container having a bottom opening and are arrayed in a facing state, through said bottom opening, said apparatus comprising:

a rotationally driving shaft having a cylindrical shape, configured to contact the peripheral edges of the substrates from below and to drive the substrates to rotate all together, said driving shaft having a rotational axis in parallel to a direction in which the substrates are arrayed;

a plurality of idle pulleys independent of each other and arranged on one side of said driving shaft, to contact the peripheral edges of the substrates from below, said idle pulleys having a rotational axis parallel to the rotational axis of said driving shaft, and being supported by a freely rotatable common pulley shaft, wherein each one of the substrates is supported by said driving shaft and idle pulleys while the substrates are rotated by said driving shaft;

a stopper arranged on another side of said driving shaft, configured to stop rotation of the substrates by contacting the peripheral edges of the substrates, wherein said stopper is arranged such that the peripheral edge of each one of the substrates comes into contact with said stopper when each one of the substrates engages with said driving shaft by their notch and thus the substrates lean;

an optical notch sensor configured to confirm alignment of the notches; and a holder configured to hold said substrates all together in said container at a height separated from a bottom wall of said container, when alignment of the notches is confirmed.

12. The apparatus according to claim 11, comprising a work table configured to mount said container and a guide configured to guide said container on said work table.

13. The apparatus according to claim 12, comprising an elevating mechanism configured to move said driving shaft, said idle pulleys, said stopper, and said holder up and down in said container through said bottom opening, said elevating mechanism is designed such that said holder is moved along with said driving shaft, said idle pulleys, and said stopper, up and down in a stroke shorter than those of said driving shaft, said idle pulleys, and said stopper.

14. The apparatus according to claim 13, wherein said work table comprises an access opening arranged to face said bottom opening of said container such that said driving shaft, said idle pulleys, and said stopper are retreated under said access opening by said elevating mechanism.

15. The apparatus according to claim 12, comprising an elevating mechanism configured to move said driving shaft, said idle pulleys, and said stopper up and down in said container through said bottom opening.

16. The apparatus according to claim 11, comprising a rotational driving mechanism configured to drive said driving shaft and said pulley shaft to rotate along with each other in the same direction.

17. The apparatus according to claim 16, wherein said driving shaft has a diameter smaller than an opening width of said notches.

18. The apparatus according to claim 16, wherein said driving shaft and said pulley shaft have a ratio of rotational speeds, which is set such that said driving shaft and said idle pulleys have the same peripheral velocity.

19. The apparatus according to claim 18, wherein said rotational driving mechanism comprises a common motor, and a transmission configured to transmit a rotationally driving force of said common motor to said driving shaft and said pulley shaft with gear ratios different from each other.

* * * * *